(12) United States Patent
Huang et al.

(10) Patent No.: US 7,873,896 B2
(45) Date of Patent: Jan. 18, 2011

(54) HIGH PERFORMANCE PULSED STORAGE CIRCUIT

(75) Inventors: Chih-Wei Huang, Austin, TX (US); Marlin Wayne Frederick, Jr., Austin, TX (US); Stephen Andrew Kvinta, Cedar Park, TX (US); Kerry Karl Nick, Austin, TX (US)

(73) Assignee: ARM Limited, Cambridge (GB)

( * ) Notice: Subject to any disclaimer, the term of this patent is extended or adjusted under 35 U.S.C. 154(b) by 203 days.

(21) Appl. No.: 12/285,327

(22) Filed: Oct. 1, 2008

(65) Prior Publication Data

US 2010/0083062 A1    Apr. 1, 2010

(51) Int. Cl.
*G11C 29/00* (2006.01)
(52) U.S. Cl. .................. 714/769; 714/718
(58) Field of Classification Search ............. 327/38, 327/203; 365/192; 714/724, 726, 805, 43, 714/769, 718
See application file for complete search history.

(56) References Cited

U.S. PATENT DOCUMENTS

| | | | | |
|---|---|---|---|---|
| 3,794,854 A | * | 2/1974 | Hanson et al. | 327/38 |
| 5,377,199 A | * | 12/1994 | Fandrich | 714/726 |
| 7,221,205 B2 | * | 5/2007 | Kinkade et al. | 327/203 |
| 7,496,813 B1 | * | 2/2009 | Houlihane et al. | 714/724 |
| 7,710,798 B2 | * | 5/2010 | Pillai | 365/192 |

OTHER PUBLICATIONS

V. G. Oklobdzija, "Clocking and clocked storage elements in a multi-gigahertz environment" *IBM Journal of Research and Development*, vol. 47, No. 5/6, 2003, from http://researchweb.watson.ibm.com/journal/rd/475/oklobdzija.html, pp. 1-13.
J. Tschanz et al, "Comparative Delay and Energy of Single Edge-Triggered & Dual Edge-Triggered Pulsed Flip-Flops for High-Performance Microprocessors" *ISLPED '01*, Aug. 2001, pp. 147-152.

* cited by examiner

*Primary Examiner*—David Ton
(74) *Attorney, Agent, or Firm*—Nixon & Vanderhye P.C.

(57) ABSTRACT

The application discloses storage circuitry with a pulse generator used to control switches on two inputs to the storage circuitry thereby connecting either operational data or diagnostic data to the storage circuitry. Thus, the pulse generator selects the data paths by outputting pulses to a diagnostic output or to a functional output, and these pulses controlling the switches on the two inputs to the storage circuitry.

12 Claims, 7 Drawing Sheets

HIGH PERFORMANCE PULSED STORAGE CIRCUIT

BACKGROUND OF THE INVENTION

1. Field of the Invention

The field of the invention relates to data processing and in particular to storage circuits for storing either operational or diagnostic data that are clocked by pulses.

2. Description of the Prior Art

Sequential storage circuits that store data in response to a clock signal in data processing circuits are known. These circuits include latch circuits and flip flops and are very important elements of a processing circuit from both a delay and energy standpoint. Flip flops can take the form of master slave latches which input the data to the master latch during the first phase of the clock cycle and transfer it to the slave latch during the second phase of the clock cycle. This makes them look as though they store data in response to an edge, in other words they appear edge triggered.

An alternative design to these master slave flip flops is a pulse triggered flip flop which stores data in a single latch in response to a pulse. If the pulse is small and occurs on the edge of the clock it also looks as though the storage element or latch is edge triggered. In effect the latch is transparent when the pulse is high so the storage element can receive the data during the pulse and then opaque when the pulse is low so that it is isolated from the input. However, the pulse must be wide enough for the storage element to be able to react during the pulse width and store the data.

These devices are used to store operational or functional data during processing and they are also often used to store diagnostic data. In such cases they often operate in one of two modes, these being diagnostic mode and operational mode. Such a flip flop traditionally has a scan input and a data input. The scan input receiving diagnostic data and the operational input receiving operational data. The mode of operation is controlled by a scan enable signal, the diagnostic mode being entered when the scan enable signal is high and in this mode diagnostic data is received, stored and output. When the scan enable signal is low operational data is received, stored and output instead.

FIG. 1a shows a traditional non-inverting scannable pulsed flip flop 30. This device comprises a pulse generator 20 having a clock input, clock delay elements 22, and a NAND gate 24 for combining the clock and the delayed clock to generate the pulse. The flip flop itself comprises driving circuits 34 and 36 on the respective inputs that are turned on and off in response to a scan enable signal. Thus, when scan enable is high, driving circuit 34 is switched on and data at the scan input is driven, while when scan enable is low, driving device 36 is on and drives the operational data. In order for the flop to act as a pulsed flop a transmission gate 38 is provided on the forward data path and this is turned on and off by pulses from pulse generator 20.

Such traditional pulsed flip flops have the advantages of high speed performance and low area due to only having a single latch as compared to the the master slave flip flop. However, they do require additional logic in the clock circuit to generate the pulse. Such additional logic requires a significant amount of power. In this example, it can be seen that the pulsed flop adds a multiplexer in the data path to form a mux-d flop to provide the data and scan input. This mux-d flop requires tristate inverters to drive the inputs in both the operational data path and the scan path through transmission gate 38 that is present in the forward data path to make the flop a pulse driven flop. These additional transistors add delay to the circuit and impact the timing performance. They also consume power.

FIG. 1b shows a traditional inverting scannable pulse flip flop. This device is similar to the non-inverting scannable pulse flip flop and suffers from the same drawbacks.

Details of different flip-flops and their comparative performances can be found in "Comparative Delay and Energy of Single Edge-Triggered and Dual Edge-Triggered Pulsed Flip-Flops for High-Performance Microprocessors" by Tschanz et al.

It would be desirable to improve the speed and performance of such devices.

SUMMARY OF THE INVENTION

A first aspect of the present invention provides state storage circuitry comprising: an operational data input for receiving input data, a diagnostic data input for receiving diagnostic data and a diagnostic select signal input; a storage element for storing a value indicative of data received from one of said operational data input and said diagnostic data input; an output for outputting said value stored in said storage element; a pulse generator for generating pulses in response to a clock signal, said pulse generator comprising a diagnostic output and a functional output and being responsive to receipt of a diagnostic enable signal at said diagnostic select signal input to output said generated pulses at said diagnostic output and not to output said generated pulses at said functional output and being responsive to receipt of a diagnostic disable signal at said diagnostic select signal input to output said generated pulses at said functional output and not to output said generated pulses at said diagnostic output; an operational path switch for receiving said pulses from said functional output and being responsive to receipt of each of said pulses to provide a transmission path from said operational data input to said storage element and being responsive to receipt of no pulse to isolate said storage element from said operational data input; and a diagnostic path switch for receiving said pulses from said diagnostic output and being responsive to receipt of each of said pulses to provide a transmission path from said diagnostic data input to said storage element and being responsive to receipt of no pulse to isolate said storage element from said diagnostic data input.

The present invention recognizes that many of the problems of the prior art devices are due to the circuitry on the forward data path. It also recognizes that if the control for switching between operational and diagnostic modes using the diagnostic enable signal could be removed from the storage circuit itself and placed in the pulse generator then it may be possible to remove some of the circuitry previously required on the forward data path and thus, improve the speed of the device.

Thus, it provides a pulse generator with two outputs, the pulse generator outputting pulses to a diagnostic output in response to the diagnostic enable signal indicating that the circuit should operate in diagnostic mode, and outputting pulses to a functional output when the diagnostic disable signal indicates that operational or functional mode should be used.

These pulses are used to control switches on the two inputs to the storage element thereby connecting the operational data input to the storage element in response to pulses output in operational mode and connecting the diagnostic data input to the storage element in response to pulses output in diagnostic mode. The storage element can then store and output a value indicative of the data. This may be the data itself or it may be an inverted form of the data.

In this way the circuit selects the particular data paths to use in response to pulses generated by a pulse generator and therefore the circuit no longer needs circuit elements on the forward data path that are controlled directly by the diagnostic enable signal. This reduces the amount of circuitry required on the forward data path and thereby increases the speed of the storage circuitry on both the operational and diagnostic paths. A disadvantage is that the clock pin has to drive more gate capacitance and therefore the clock output delay is slightly slower.

It should be clear to a skilled person that the operational path switch and the diagnostic path switch are different switches located on different pathways. Both switches react to pulses in the same way, but receive pulses from different sources and these sources output pulses at different times. Thus, in diagnostic mode, pulses are output by the diagnostic output and the diagnostic path switch receives the pulses, while in operational mode pulses are output by the functional output and the operational path switch receives them.

In some embodiments, said operational path switch comprises insertion circuitry responsive to receipt of said pulses from said functional output to drive said data at said operational data input to said storage element and being responsive to receipt of no pulse to isolate said storage element from said operational data input; and said diagnostic path switch comprises insertion circuitry responsive to receipt of said pulses from said diagnostic output to drive said data at said diagnostic data input to said storage element and being responsive to receipt of no pulse to isolate said storage element from said diagnostic data input.

Although the operational and diagnostic path switches can take a number of forms in some embodiments they comprise insertion circuitry that can drive the data value into the storage element. The use of such driving circuits increases the performance of the flop and helps to overcome resistance on the path due to other circuit elements.

Although these path switches comprising drive elements can take a number of forms in some embodiments they comprise tri-state inverters respectively responsive to receipt of pulses from either the functional output or the diagnostic output to drive data received at their respective inputs to the storage element.

In alternative embodiments these switches may each comprise an inverter and a transmission gate, the transmission gate being responsive to the pulses from the respective outputs to switch on and allow the data input to be driven through by the inverter.

In some embodiments, said diagnostic select signal input comprises a diagnostic enable signal input and said diagnostic enable signal is a signal received at said diagnostic enable signal input with a predetermined logic level and said diagnostic disable signal is a signal received at said diagnostic enable signal input with an opposite logic level.

Although the diagnostic enable signal can have a number of forms generally it has a particular logic level perhaps VDD to indicate that diagnostic mode is entered and pulses should be output at the diagnostic output and another logic level perhaps VSS to indicate that operational mode is current and pulses should be output at the functional output. This other logic level can be seen as the diagnostic disable signal. Thus, in effect when the diagnostic enable signal is active diagnostic mode is entered, while when it is inactive operational mode is entered.

Although the pulse generator can take a number of forms provided that pulses are output by two different outputs, one output outputting pulses during the functional mode and the other during the diagnostic mode, in some embodiments said pulse generator comprises two pulse generators, one of said pulse generators comprising said functional output and generating pulses in response to said clock signal and receipt of said diagnostic disable signal and a second of said pulse generators comprising said diagnostic output and generating pulses in response to said clock signal and receipt of said diagnostic enable signal.

Alternatively the pulse generator may be a single pulse generator with two outputs one being a functional output and the other a diagnostic output each outputting pulses during their respective mode of operation.

In some embodiments, said storage element comprises a latch circuit.

Although the latch circuit can take a number of forms as is well known in the art, in some embodiments, said storage element comprises a double tristated inverter responsive to both said functional and said diagnostic pulses and an inverter arranged in a feedback loop.

If a feedback circuit having a tristated inverter and an inverter arranged in a feedback loop is used as the latching circuit then as the circuit has two modes of operation and is responsive in particular modes to pulses output from different outputs, the tristate inverter in the feedback loop should be a double tristated inverter that is responsive to either set of pulses. The circuit being arranged such that the tristate inverter receives pulses from both the functional and diagnostic outputs of the pulse generator.

In some embodiments, said pulse generator comprises delay circuitry for adding a delay to said clock signal said pulse generator comprising circuitry for combining said clock signal and said delayed clock signal to generate said pulse signal.

Although the pulse generator can be formed in a number of ways, in some embodiments it comprises delay circuitry, this being a simple way to generate pulses.

In some embodiments, said circuitry for combining said clock signal and said delayed clock signal comprises two AND gates, a first AND gate comprising three inputs for receiving said clock signal, said delayed clock signal and a positive indication of said diagnostic disable signal and comprising an output, said output comprising said functional output of said pulse generator, and a second AND gate comprising three inputs for receiving said clock signal, said delayed clock and a positive indication of said diagnostic enable signal and comprising an output, said output comprising said diagnostic output of said pulse generator.

A simple way to provide two outputs of pulses, one being output when the diagnostic enable signal is present and the other being output when the diagnostic disable signal is present is to use two AND gates that are responsive to the clock signal and the delayed clock signal to generate the pulse and that are also responsive to these enable and disable signals such that when the diagnostic enable signal indicates that the circuit is operating in diagnostic mode the diagnostic output outputs the pulse whereas when the diagnostic disable signal indicates that the circuit is operating in operational mode the functional output outputs the pulses. In this respect as AND logic is used, a positive indication of the signals must be used, so that although the diagnostic enable signal could have a logical low value to represent diagnostic mode if this is the case this signal should be inverted for input to the AND gate to provide the positive indication of the signal.

A further aspect of the present invention provides a method of storing and outputting operational or diagnostic data, said method comprising the steps of: receiving operational data at an operational data input; receiving diagnostic data at a diagnostic data input; receiving a clock signal and generating pulses therefrom; and in response to receipt of a diagnostic disable signal: outputting said generated pulses to an operational path switch that lies between said operational data input and a storage element; in response to receipt of said pulses, said operational path switch transmitting said operational data received at said operational data input to said storage element, said storage element storing a value indicative of said data and outputting said stored value and in response to receipt of no pulse said operational path switch isolating said operational data input from said storage element, such that during receipt of said diagnostic disable signal operational data is stored and output; and in response to receipt of a diagnostic enable signal: outputting said generated pulses to a diagnostic path switch that lies between said diagnostic data input and said storage element; in response to receipt of said pulses said diagnostic path switch transmitting said diagnostic data received at said diagnostic data input to said storage element, said storage element storing a value indicative of said data and outputting said stored value, and in response to receipt of no pulse said diagnostic path switch isolating said diagnostic data input from said storage element, such that during receipt of said diagnostic enable signal diagnostic data is stored and output.

A yet further aspect of the present invention provides Means for storing state comprising: an operational data input means for receiving input data, a diagnostic data input means for receiving diagnostic data and a diagnostic enable signal input means; a storage means for storing a value indicative of data received from one of said operational data input means and said diagnostic data input means; an output means for outputting said value stored in said storage means; a means for generating pulses in response to a clock signal, said means comprising a functional output and a diagnostic output and said means being responsive to receipt of an inactive diagnostic enable signal at said diagnostic enable signal input means to output said generated pulses at said functional output and not to output said generated pulses at said diagnostic output, said means being responsive to receipt of an active diagnostic enable signal at said diagnostic enable signal input means to output said generated pulses at said diagnostic output and not to output said generated pulses at said functional output; an operational path switching means for receiving said pulses from said functional output and being responsive to receipt of each of said pulses to provide a transmission path from said operational data input means to said storage means and being responsive to receipt of no pulse to isolate said storage means from said operational data input means; and a diagnostic path switching means for receiving said pulses from said diagnostic output and being responsive to receipt of each of said pulses to provide a transmission path from said diagnostic data input means to said storage means and being responsive to receipt of no pulse to isolate said storage means from said diagnostic data input means.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1A:
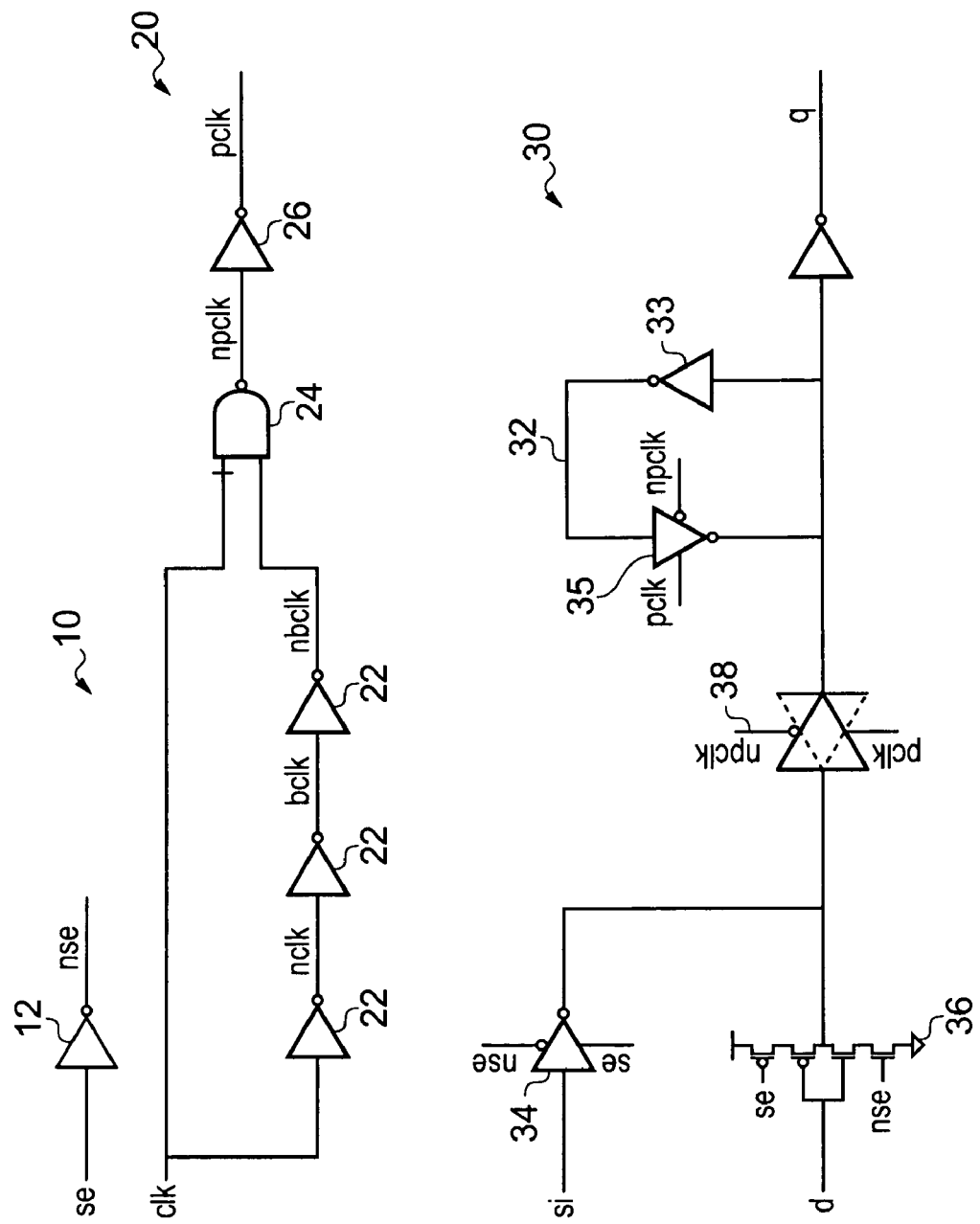
FIG. 1a schematically shows a traditional non-inverting scannable flip flop.
Figure 1B:
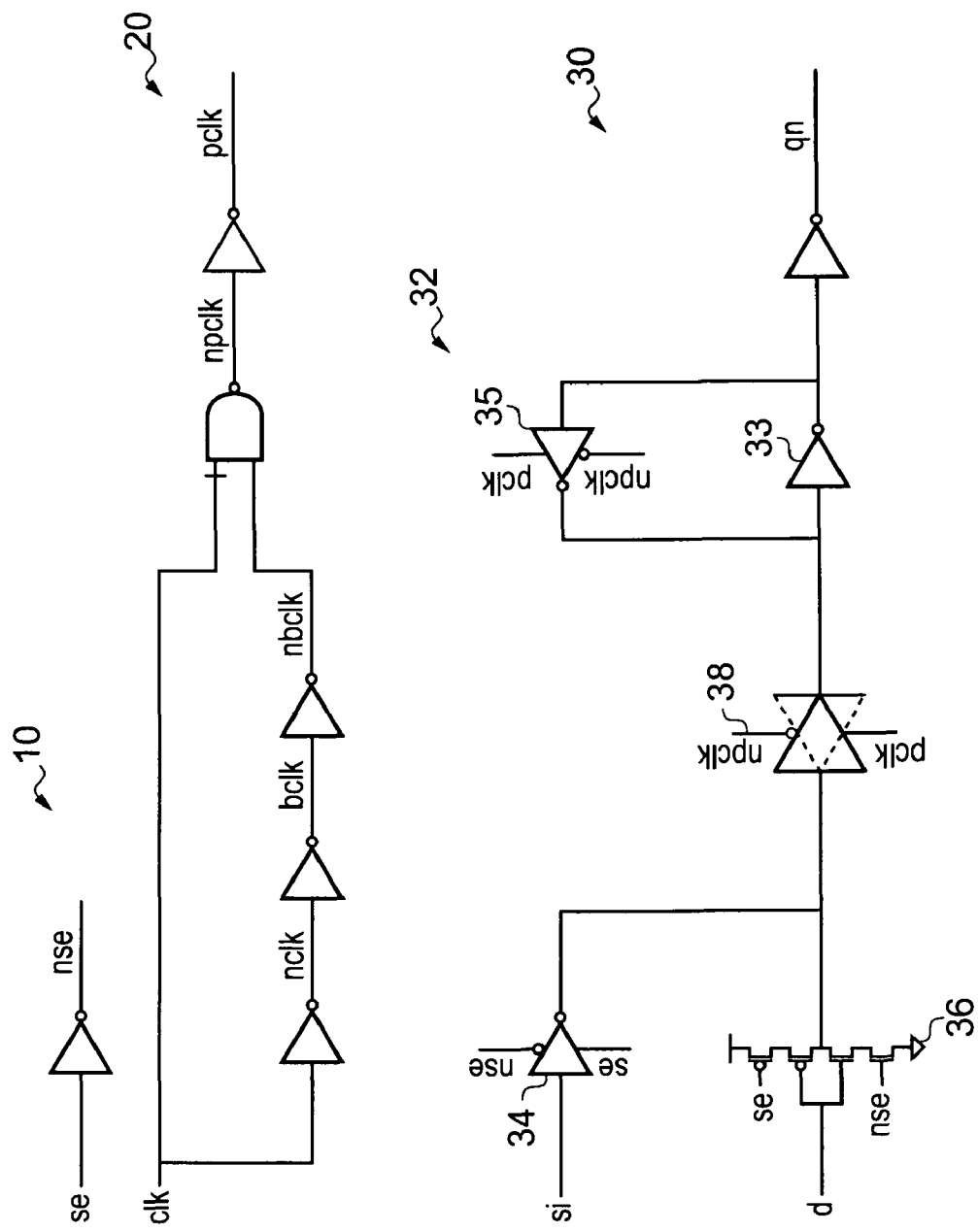
FIG. 1b schematically shows a traditional inverting scannable flip flop.
Figure 2:
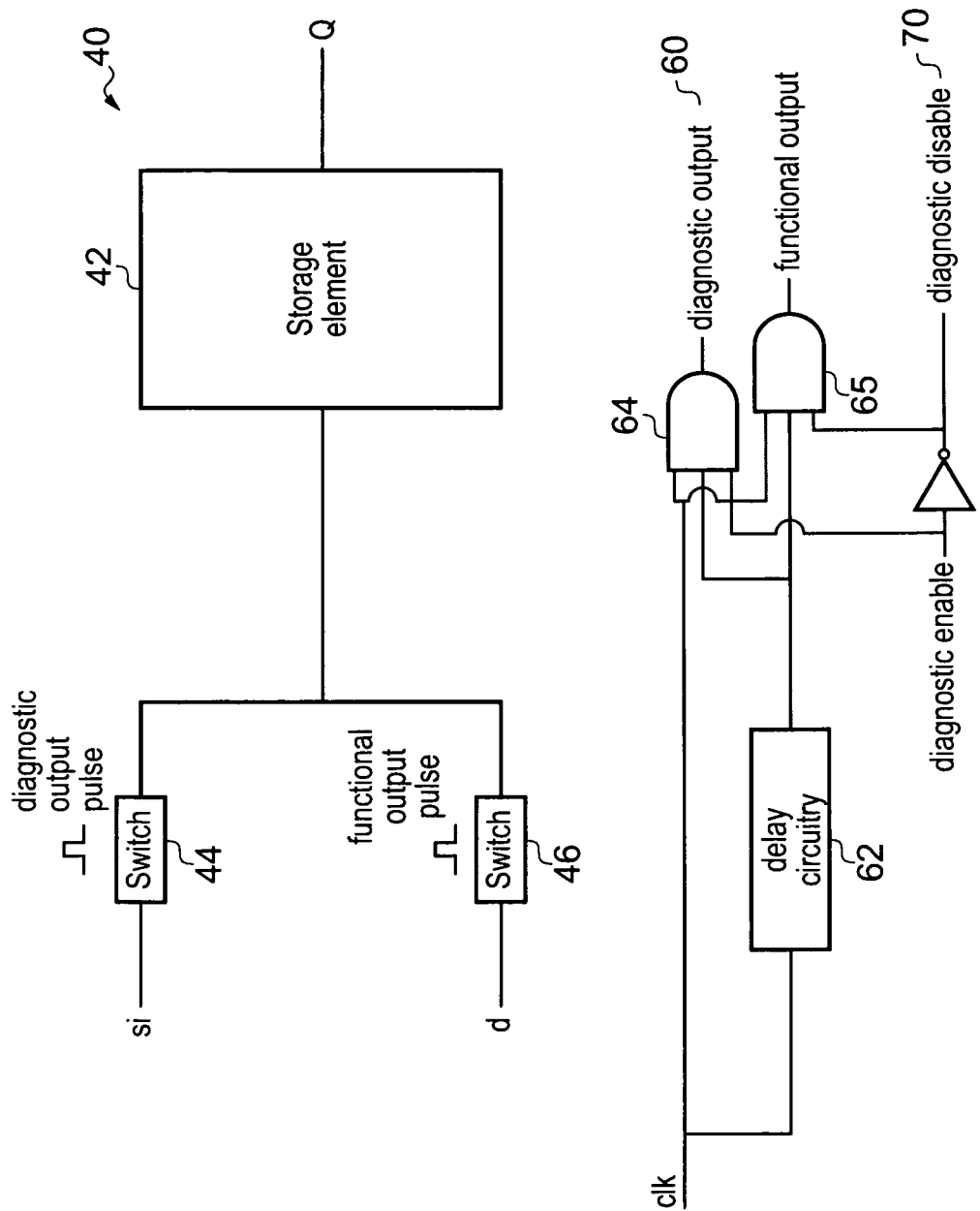
FIG. 2 schematically shows in block diagram form a circuit according to an embodiment of the present invention.

FIG. 2 shows in block diagram form a circuit according to an embodiment of the present invention. This circuit comprises an operational data and diagnostic data storage and output circuit 40 and a pulse generator 60. This operational data and diagnostic data storage and output circuit 40 is in effect a non-inverting scannable pulsed flip flop. It comprises two input paths a scan or diagnostic input path Si and a functional or operational data input path d. In each of these two paths there is a switch. In the diagnostic path the switch 44 is driven by a pulse output from a diagnostic output of pulse generator 60. In the operational data path the switch 46 is driven by a pulse output from the functional output of the pulse generator 60.

Pulse generator 60 comprises a clock input clk and delay circuitry 62 that acts to delay the input clock signal. The clock signal and the delayed clock signal are combined together using circuitry 64 and 65 to generate pulses whose width is dependent on the delay of the delay circuitry 62.

Pulse generator 60 also comprises a diagnostic select signal input which signal indicates whether the device should operate in diagnostic or operational mode. This signal is input into circuitry 64 and 65, which circuitry comprises AND gates that each receive the clock signal, the delayed clock signal and either the diagnostic enable signal or the inverted diagnostic enable signal. The inverted diagnostic enable signal acts as the diagnostic disable signal. Thus, when the diagnostic enable signal is high pulses are output from AND gate 64, i.e. from the diagnostic output. When the diagnostic enable signal is low, the diagnostic disable signal is high and the pulses are output via AND gate 65 at the functional output.

Thus, in this circuit the diagnostic enable signal is input to the pulse generator 60 and not to the pulsed flip flop 40. However, the pulse generator is arranged such that it outputs pulses from different outputs in dependence upon the diagnostic enable signal and thus, this feature can be used so that the two switches 44 and 46 on the diagnostic data path and the operational data path can be independently controlled depending on the diagnostic enable signal value. Thus, switch 44 switches diagnostic data from the scan or diagnostic input Si into the storage element in response to pulses output by the diagnostic output 64 and switch 46 switches operational data from the operational data input d into storage element 42 in response to pulses output by functional output 65. In this way a scannable pulsed flip flop whose operation is similar to those of the prior art is formed without the need to input the diagnostic enable signal into the flip flop itself and therefore with the need for fewer circuit is elements in the forward data path.

Figure 3:
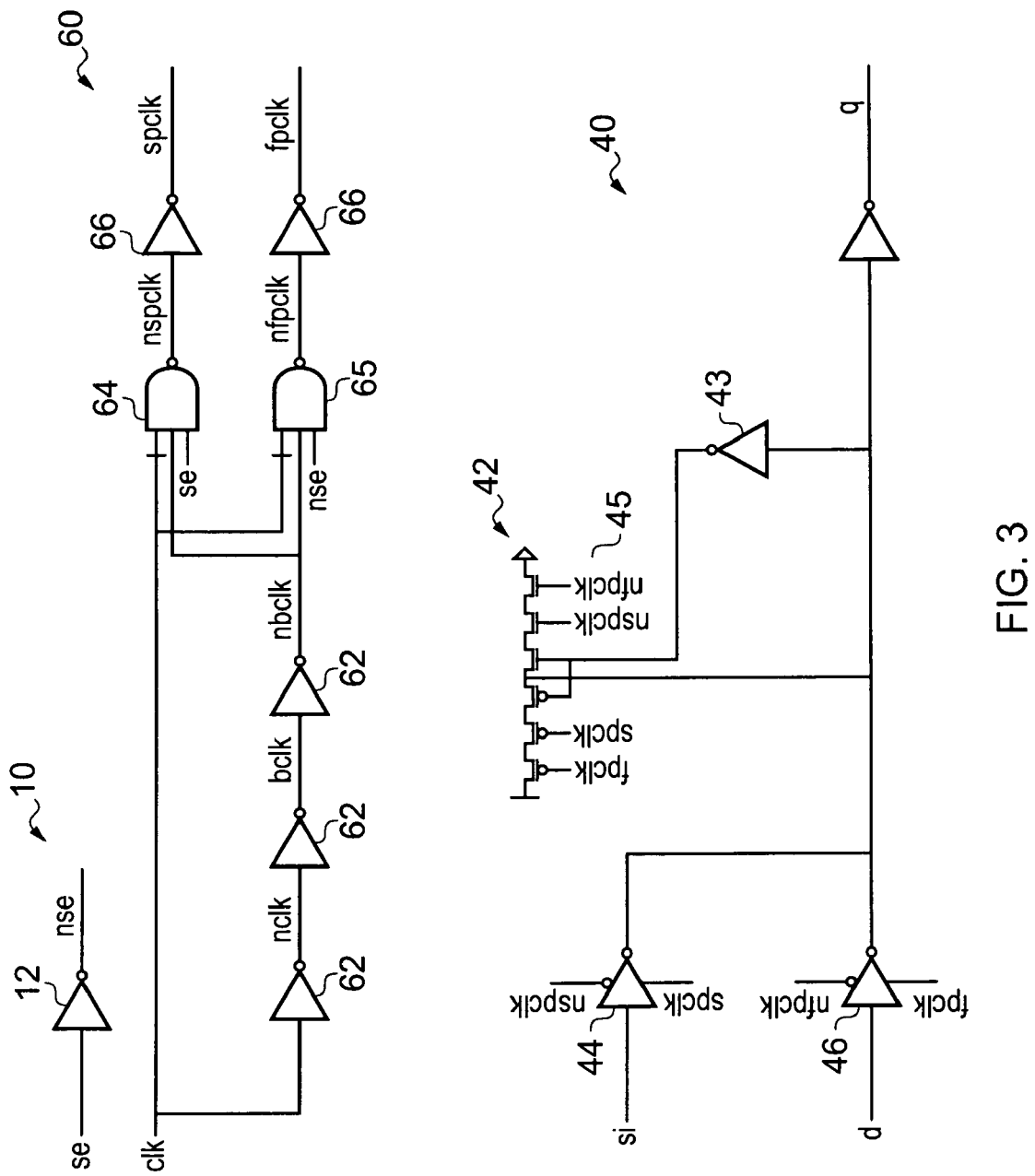
FIG. 3 shows schematically in circuit diagram form a non-inverting scannable pulse flip flop according to an embodiment of the present invention.

FIG. 3 shows in circuit form a non-inverting scannable pulsed flip flop according to an embodiment of the present invention. In this Figure the same reference numbers are used to indicate corresponding features to those illustrated in FIG.

2. In this embodiment the diagnostic enable signal is in the form of a scan enable signal SE and the diagnostic disable signal is in effect the inverted form of this NSE. This signal is used to select which of the two pulse outputs should be used to output pulses from the pulse generator 60. Thus, the diagnostic output outputs pulses spclk while the functional output outputs pulses fpclk.

In this embodiment, the clock delay circuitry is in the form of three inverters 62. Inverters are commonly used as delay elements and any odd number of inverters can be used, the length of the delay being related to the number of inverters in the delay circuit. NAND gates 64 and 65 are used to combine the clock signal and delayed clock signal to generate the pulses, the NAND gates having respectively SE and NSE as additional inputs. These additional inputs serve to select which gate the pulses are output from. The output pulse signals are then inverted using inverters 66.

The functional pulses fpclk and the scan pulses spclk are used to drive driving elements 46 and 44 on the operational data path and the diagnostic data path respectively. These driving elements are in this embodiment tristate inverters. Thus, these tristate inverters drive data into the storage element 42 in response to the pulses received. The storage element 42 is formed from an inverter 43 and a double tristated inverter 45 that is responsive to both the functional pulses and the scan pulses. Thus, when a functional pulse signal fpclk is output from the functional output of pulse generator 60 via NAND gate 65 and inverter 66, tristate inverter 46 drives operational data from data input d into the storage element 42. When the level of fpclk goes to VSS, the inverter 43 and double tristated inverter 45 start to work and keep the data. Similarly when the scan pulse signal spclk is output from the diagnostic output of the pulse generator 60 via NAND gate 64 and inverter 66, tristate inverter 44 drives the scan input si into the storage element 42. When the logic level of spclk goes to VSS, the feedback loop turns on and keeps the scan data.

Figure 4:
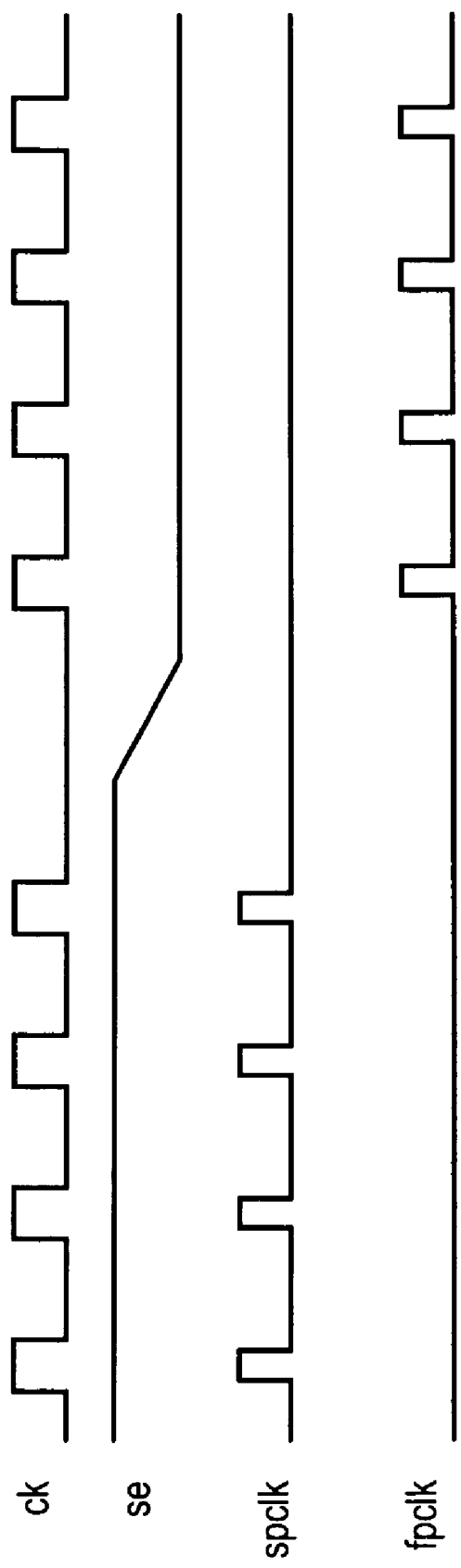
FIG. 4 shows a timing diagram indicating the operation of the non-inverting scannable pulse flip flop of FIG. 3.

FIG. 4 shows the timing diagrams of the clock and pulse signals of the non-inverting scannable pulsed flop of FIG. 3. As can be seen when scan enable is high diagnostic mode is entered and pulses are output at diagnostic output as signal spclk while when scan enable is low pulse signal fpclk is output at functional output. These pulses are generated by pulse generator 60 in response to clock signal CK. Thus, they appear towards the rising edge of the clock signal and make the pulse flop appear to act like an edge triggered device.

It should be noted that these clock waveforms show sharp edges and although they are illustrated in an idealized way in this Figure it is important that both the clock and SE waveforms have sharp edges and not ramps to avoid glitches. In addition, the setup time has been improved dramatically by this technique but there is a trade off with the hold time being increased. The delay of the combinational logic should therefore be considered for the stability of the circuit.

Figure 5:
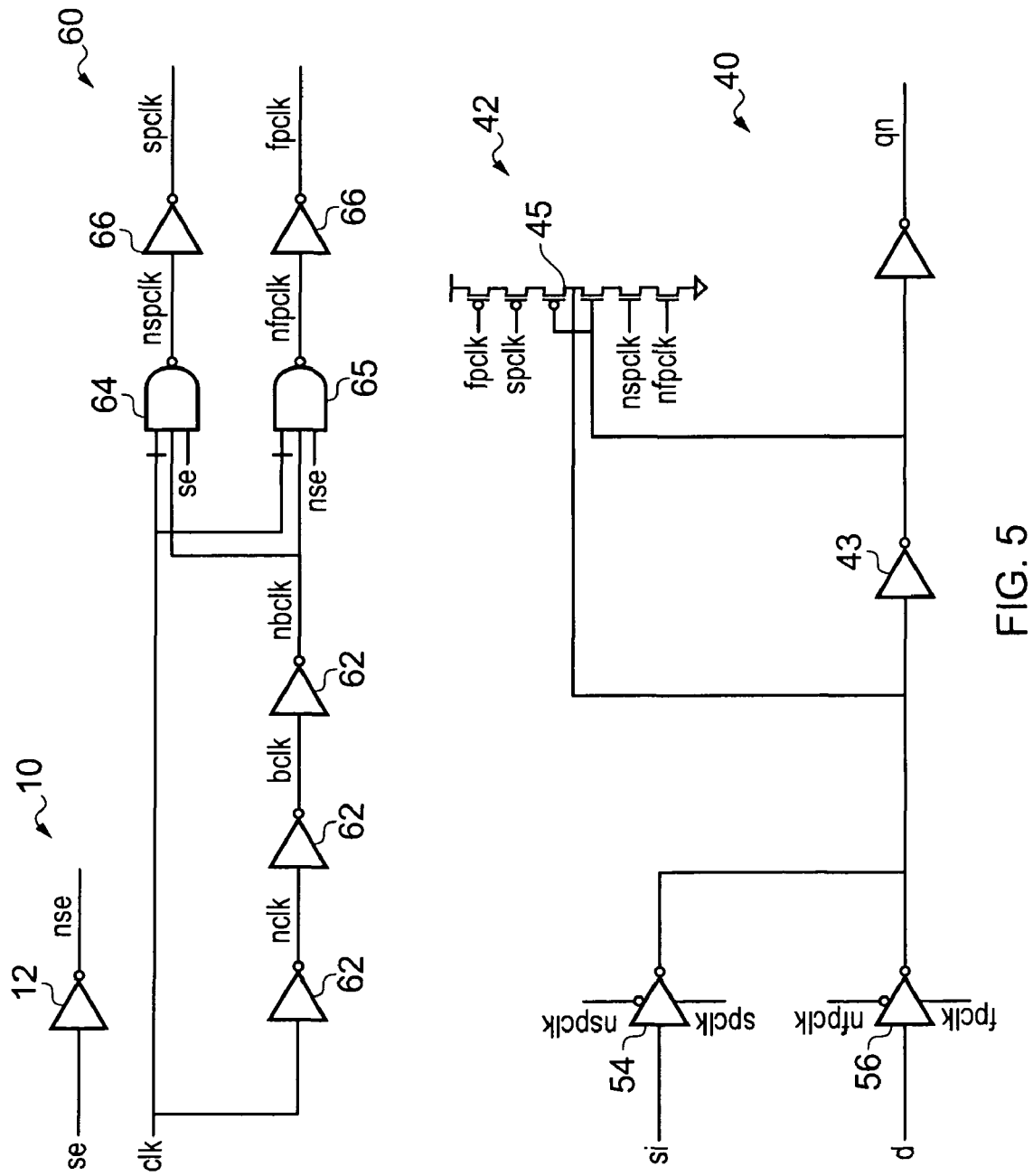
FIG. 5 shows a inverting scannable pulse flip flop according to an embodiment of the present invention.

FIG. 5 shows a circuit similar to that of FIG. 3 except that in this case the circuit is an inverting scannable pulsed flop. Thus, the output is the inverse of the data input. This inverted pulse flop has been achieved by rotating the forward path inverter and feedback path inverter of the non-inverting scannable pulsed flop of FIG. 3.

It should be noted that although a non-inverting pulsed flop and inverting pulsed flops have been illustrated, additional gates can be added to implement set, reset and set-reset flops as would be clear to a skilled person. The function of AND, MUX and OR can also be implemented by adding logic gates in the data path. The important thing is that rather than inputting the diagnostic enable signal to the diagnostic path or operational path, it is input to the clock circuit, i.e. the pulse generating circuit and pulses output from two outputs are used to control the different diagnostic and operational modes.

It should also be appreciated that the tristate inverters on the operational data path and diagnostic data path can be replaced with inverters driving transmission gates. Alternatively, other switching or driving devices can be used.

A disadvantage of the flop is that the clock pin has to drive more gate capacitance and therefore the clock output delay is slightly slower. Also the pulses can be affected by temperature and voltage and thus, simulation of all PVT corners should be run to make sure the pulse is not degraded by process variations.

It should be noted that this pulsed flop will tend to consume more power than a traditional pulsed flop, however its timing is much quicker. Thus, in chip design where the speed of the flop is important it will be preferred. Furthermore, in some circumstances an increase in the speed of the flop can reduce the number of devices in a path and in these situations the flop of embodiments of the present invention would be very advantageous. Thus, although this pulsed flop may consume more power than a traditional pulsed flop, as it can be used to reduce the number of devices in a chip it may actually reduce the total power consumed by a chip when compared to one containing traditional pulsed flops.

Figure 6:
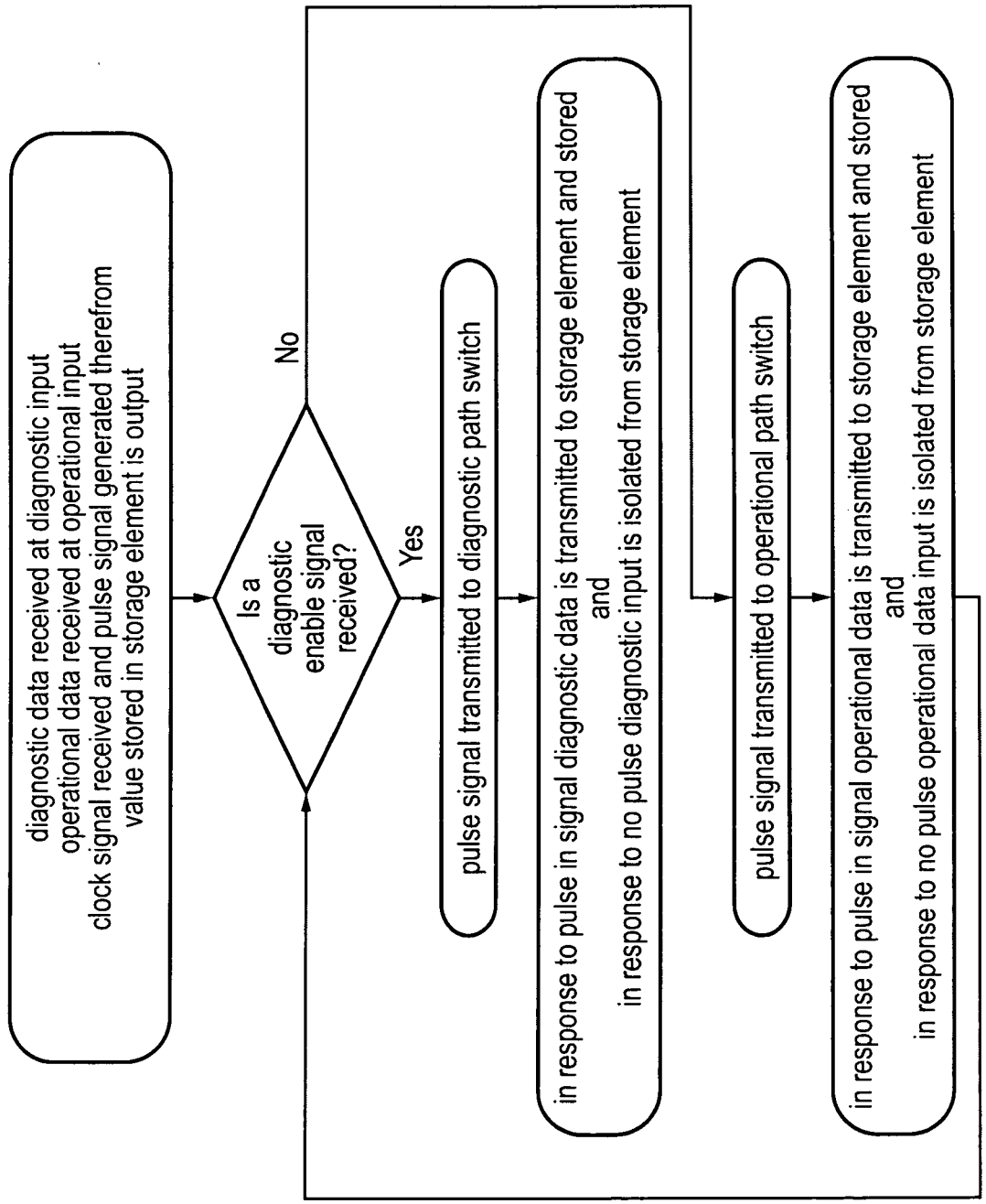
FIG. 6 shows a flow diagram illustrating a method according to an embodiment of the present invention.

FIG. 6 shows a flow diagram illustrating steps in a method for storing and outputting operational or diagnostic data according to an embodiment of the present invention. Diagnostic and operational data are received at respective inputs of a storage circuit and a clock signal is also received and pulse is generated from it. The value currently stored in the storage element is output.

The storage element is updated with data from either the operational data input or the diagnostic data input according to the following steps. Firstly it is determined whether a diagnostic enable signal is received. If it is then diagnostic mode is entered and the pulse signal generated from the clock signal is output to a diagnostic path switch. This transmits diagnostic data from the diagnostic data input to the storage element in response to a pulse and isolates the input from the storage element when there is no pulse present. Thus, in diagnostic mode the storage element is updated with diagnostic data in response to each pulse received.

If the diagnostic enable signal is not present then operational or functional mode is entered and the pulses generated from the clock signal are transmitted to an operational path switch. In response to a pulse this switch turns on and transmits data from the operational data input to the storage element where it is stored and in response to no pulse it isolates the operational data input from the storage element. Thus, in operational mode the storage element is updated with operational data in response to each pulse received.

The method switches between these different modes of operation in dependence upon the diagnostic enable signal.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. State storage circuitry comprising:
    an operational data input for receiving input data, a diagnostic data input for receiving diagnostic data and a diagnostic select signal input;
    a storage element for storing a value indicative of data received from one of said operational data input and said diagnostic data input;
    an output for outputting said value stored in said storage element;
    a pulse generator for generating pulses in response to a clock signal, said pulse generator comprising a diagnostic output and a functional output and being responsive to receipt of a diagnostic enable signal at said diagnostic select signal input to output said generated pulses at said diagnostic output and not to output said generated pulses at said functional output and being responsive to receipt of a diagnostic disable signal at said diagnostic select signal input to output said generated pulses at said functional output and not to output said generated pulses at said diagnostic output;
    an operational path switch for receiving said pulses from said functional output and being responsive to receipt of each of said pulses to provide a transmission path from said operational data input to said storage element and being responsive to receipt of no pulse to isolate said storage element from said operational data input; and
    a diagnostic path switch for receiving said pulses from said diagnostic output and being responsive to receipt of each of said pulses to provide a transmission path from said diagnostic data input to said storage element and being responsive to receipt of no pulse to isolate said storage element from said diagnostic data input.

2. State storage circuitry according to claim 1, wherein
    said operational path switch comprises insertion circuitry responsive to receipt of said pulses from said functional output to drive said data at said operational data input to said storage element and being responsive to receipt of no pulse to isolate said storage element from said operational data input; and
    said diagnostic path switch comprises insertion circuitry responsive to receipt of said pulses from said diagnostic output to drive said data at said diagnostic data input to said storage element and being responsive to receipt of no pulse to isolate said storage element from said diagnostic data input.

3. State storage circuitry according to claim 2, wherein said operational path switch comprises a tristate inverter responsive to receipt of one of said pulses from said functional output to drive data received at said operational data input to said storage element; and
    said diagnostic path switch comprises a tristate inverter responsive to receipt of one of said pulses from said diagnostic output to drive data received at said diagnostic data input to said storage element.

4. State storage circuitry according to claim 2, wherein said operational path switch comprises an inverter and a transmission gate, said transmission gate being responsive to said pulses output from said functional output; and
    said diagnostic path switch comprises an inverter and a transmission gate, said transmission gate being responsive to said pulses output from said diagnostic output.

5. State storage circuitry according to claim 1, wherein said diagnostic select signal input comprises a diagnostic enable signal input and said diagnostic enable signal is a signal received at said diagnostic enable signal input with a predetermined logic level and said diagnostic disable signal is a signal received at said diagnostic enable signal input with an opposite logic level.

6. State storage circuitry according to claim 1, wherein said storage element comprises a latch circuit.

7. State storage circuitry according to claim 6, wherein said storage element comprises a double tristated inverter responsive to pulses output from both said functional and said diagnostic output and an inverter arranged in a feedback loop.

8. State storage circuitry according to claim 1, wherein said pulse generator comprises two pulse generators, one of said pulse generators comprising said functional output and generating pulses in response to said clock signal and receipt of said diagnostic disable signal and a second of said pulse generators comprising said diagnostic output and generating pulses in response to said clock signal and receipt of said diagnostic enable signal.

9. State storage circuitry according to claim 1, wherein said pulse generator comprises delay circuitry for adding a delay to said clock signal said pulse generator comprising circuitry for combining said clock signal and said delayed clock signal to generate said pulse signal.

10. State storage circuitry according to claim 9, wherein said circuitry for combining said clock signal and said delayed clock signal comprises two AND gates, a first AND gate comprising three inputs for receiving said clock signal, said delayed clock signal and a positive indication of said diagnostic disable signal and comprising an output, said output comprising said functional output of said pulse generator, and a second AND gate comprising three inputs for receiving said clock signal, said delayed clock and a positive indication of said diagnostic enable signal and comprising an output, said output comprising said diagnostic output of said pulse generator.

11. A method of storing and outputting operational or diagnostic data, said method comprising the steps of:
    receiving operational data at an operational data input;
    receiving diagnostic data at a diagnostic data input;
    receiving a clock signal and generating pulses therefrom; and
    in response to receipt of a diagnostic disable signal:
        outputting said generated pulses to an operational path switch that lies between said operational data input and a storage element and not outputting said generated pulses to a diagnostic path switch that lies between said diagnostic data input and said storage element;
        in response to receipt of each of said pulses, said operational path switch transmitting said operational data received at said operational data input to said storage element, said storage element storing a value indicative of said data and outputting said stored value, such that during receipt of said diagnostic disable signal operational data is stored and output; and
    in response to receipt of a diagnostic enable signal:
        outputting said generated pulses to said diagnostic path switch that lies between said diagnostic data input and said storage element and not outputting said generated pulses to said operational path switch that lies between said operational data input and said storage element;
        in response to receipt of each of said pulses said diagnostic path switch transmitting said diagnostic data received at said diagnostic data input to said storage element, said storage element storing a value indicative of said data and outputting said stored value, such that during receipt of said diagnostic enable signal diagnostic data is stored and output.

12. Means for storing state comprising:

an operational data input means for receiving input data, a diagnostic data input means for receiving diagnostic data and a diagnostic enable signal input means;

a storage means for storing a value indicative of data received from one of said operational data input means and said diagnostic data input means;

an output means for outputting said value stored in said storage means;

a means for generating pulses in response to a clock signal, said means comprising a functional output and a diagnostic output and said means being responsive to receipt of an inactive diagnostic enable signal at said diagnostic enable signal input means to output said generated pulses at said functional output and not to output said generated pulses at said diagnostic output, said means being responsive to receipt of an active diagnostic enable signal at said diagnostic enable signal input means to output said generated pulses at said diagnostic output and not to output said generated pulses at said functional output;

an operational path switching means for receiving said pulses from said functional output and being responsive to receipt of each of said pulses to provide a transmission path from said operational data input means to said storage means and being responsive to receipt of no pulse to isolate said storage means from said operational data input means; and a diagnostic path switching means for receiving said pulses from said diagnostic output and being responsive to receipt of each of said pulses to provide a transmission path from said diagnostic data input means to said storage means and being responsive to receipt of no pulse to isolate said storage means from said diagnostic data input means.

* * * * *